US011892867B2

United States Patent
Vanek et al.

(10) Patent No.: US 11,892,867 B2
(45) Date of Patent: Feb. 6, 2024

(54) PEDAL PAD ASSEMBLIES

(71) Applicant: KSR IP Holdings, LLC, Wilmington, DE (US)

(72) Inventors: Marty Vanek, Thamesville (CA); Shaun Fuller, Thamesville (CA); Lingmin Shao, London (CA); Jaesung Kim, Ridgetown (CA); Addison Copeland, Dresden (CA); Martin Parks, Bothwell (CA)

(73) Assignee: KSR IP Holdings, LLC, Wilmington, DE (US)

( * ) Notice: Subject to any disclaimer, the term of this patent is extended or adjusted under 35 U.S.C. 154(b) by 0 days.

(21) Appl. No.: 18/116,939

(22) Filed: Mar. 3, 2023

(65) Prior Publication Data

US 2023/0280778 A1 Sep. 7, 2023

Related U.S. Application Data

(60) Provisional application No. 63/316,039, filed on Mar. 3, 2022.

(51) Int. Cl.
*G05G 1/38* (2008.04)
*G05G 1/42* (2008.04)
(Continued)

(52) U.S. Cl.
CPC .............. *G05G 1/38* (2013.01); *G05G 1/42* (2013.01); *G05G 5/05* (2013.01); *G05G 2505/00* (2013.01); *H10N 52/80* (2023.02)

(58) Field of Classification Search
CPC .. G05G 1/30; G05G 1/38; G05G 1/42; G05G 5/05; G05G 2505/00; B60T 7/042; H10N 52/80
See application file for complete search history.

(56) References Cited

U.S. PATENT DOCUMENTS 7,066,049 B2 * 6/2006 Reimann ................ B60K 26/02
74/513
7,302,713 B1 * 12/2007 Bhatt ...................... G05G 1/42
251/295
(Continued)

FOREIGN PATENT DOCUMENTS

CN 204514608 U 7/2015
CN 103332112 B 5/2016
(Continued)

OTHER PUBLICATIONS

Machine translation of DE 102006030846 A1 obtained on Jun. 27, 2023.*
(Continued)

*Primary Examiner* — Adam D Rogers
(74) *Attorney, Agent, or Firm* — Dinsmore & Shohl LLP

(57) ABSTRACT

Embodiments herein are directed to a pedal pad assembly. The pedal pad assembly includes an outer housing that has a cavity, an inner housing that has an outer surface and is slidably received within the cavity of the outer housing, a pedal pad coupled to the inner housing and is configured to translate the inner housing along a movement axis in response to a load applied to the pedal pad and a sensor assembly that includes a plurality of target members coupled to the outer surface of the inner housing and a sensor configured to sense a position of at least one target member. During a translation of the inner housing along the movement axis, at least one target member of the plurality of target members moves with the inner housing from a first position to a second position indicative of the movement of the inner housing within the cavity.

20 Claims, 6 Drawing Sheets

(51) Int. Cl.
  *G05G 5/05* (2006.01)
  *H10N 52/80* (2023.01)

(56) References Cited

U.S. PATENT DOCUMENTS

| | | | |
|---|---|---|---|
| 9,945,473 B2 | 4/2018 | Viethen | |
| 10,678,290 B2 * | 6/2020 | Stuart | G05G 5/05 |
| 10,877,507 B2 * | 12/2020 | Lee | B60T 7/06 |
| 10,948,941 B2 * | 3/2021 | Dohmen | B60T 7/06 |
| 11,292,338 B2 * | 4/2022 | Burke | B60T 8/3255 |
| 11,305,647 B2 | 4/2022 | Kim et al. | |
| 11,513,550 B1 | 11/2022 | Kim | |
| 2011/0303046 A1 | 12/2011 | Gentry | |
| 2016/0334829 A1 | 11/2016 | Kaijala | |
| 2018/0283967 A1 * | 10/2018 | Kato | G05G 1/38 |
| 2020/0001711 A1 | 1/2020 | Burke | |
| 2020/0377066 A1 | 12/2020 | Galea | |
| 2021/0004040 A1 | 1/2021 | Dohmen | |
| 2023/0114657 A1 * | 4/2023 | Wagner | B60T 7/042 303/113.4 |

FOREIGN PATENT DOCUMENTS

| | | | | |
|---|---|---|---|---|
| CN | 106274869 A | | 1/2017 | |
| CN | 110027521 A | | 7/2019 | |
| CN | 110027530 B | | 3/2022 | |
| DE | 102006030846 A1 | * | 1/2008 | B60T 7/042 |
| DE | 102010027924 A1 | * | 10/2011 | B60K 26/02 |
| DE | 102014103167 A1 | * | 9/2015 | B60K 26/02 |
| DE | 102014103167 A1 | | 9/2015 | |
| DE | 102015200669 A1 | | 7/2016 | |
| DE | 102019104936 A1 | * | 8/2020 | |
| EP | 1168136 A2 | * | 1/2002 | F15B 7/001 |

OTHER PUBLICATIONS

SENSATA: "Brake Pedal Force Sensor," https:///www.sensata.com/products/force-sensors/brake-pedal-force-sensor, Dec. 15, 2022, 7 pages.

* cited by examiner

PEDAL PAD ASSEMBLIES

CROSS-REFERENCE TO RELATED APPLICATIONS

This utility patent application claims priority benefit from U.S. provisional patent application Ser. No. 63/316,039, filed Mar. 3, 2022, and entitled "Pedal Pad Force Sensors", the entire contents of which is incorporated herein in its entirety.

TECHNICAL FIELD

The present specification generally relates to pedal assemblies for vehicles and, more specifically, to minimum-travel pedal assemblies for motor vehicles.

BACKGROUND

Conventional pedal assemblies include a pedal arm that is pivotally coupled to a housing at one end and a pedal pad positioned on an opposite end. In these pedal assemblies, various inductive or Hall Effect type sensors are positioned within the housing to measure the amount of pivot of the pedal arm with respect to the a target. When a force is applied to the pedal pad, the pedal arm pivots and, based on the amount of pivot, generally electric motors control the vehicle accordingly. However, in floor mounted pedal pads, a user may not apply the same pressure or load over the entire pedal pad. As such, load balancing and measuring small amount of travel of the pedal arm are issues.

SUMMARY

In one embodiment, a pedal pad assembly is provided. The pedal pad assembly includes an outer housing, an inner housing, a pedal pad, and a sensor assembly. The outer housing has a cavity. The inner housing has an outer surface and is slidably received within the cavity of the outer housing. The pedal pad is coupled to the inner housing and is configured to translate the inner housing along a movement axis in response to a load applied to the pedal pad. The sensor assembly includes a plurality of target members coupled to the outer surface of the inner housing and a sensor configured to sense a position of at least one target member of the plurality of target members. During a translation of the inner housing along the movement axis, at least one target member of the plurality of target members moves with the inner housing from a first position to a second position indicative of the movement of the inner housing within the cavity.

In another embodiment, a pedal assembly is provided. The pedal assembly includes an outer housing, an inner housing, a pedal pad, and a sensor assembly. The outer housing has a cavity. The inner housing has a proximate end, and opposite distal end, and an outer surface. The inner housing is slidably received within the cavity of the outer housing. The pedal pad has an annular member extending from an inner surface of the pedal pad. The annular member is coupled to the inner housing. The pedal pad and the inner housing are configured to translate along a movement axis in response to a load applied to the pedal pad. The sensor assembly has a plurality of target members coupled to the outer surface of the inner housing, a first sensor is an inductive sensing sensor having a transmitting coil and at least one receiving coil and is configured to sense a position of at least one of the plurality of target members, the least one of the plurality of target members is configured to influence an eddy current or an electric field of the first sensor, and a second sensor is a Hall Effect sensor and is configured to sense a position of a second at least one of the plurality of target members, the second at least one of the plurality of target members configured to influence a magnetic field sensed by the Hall Effect sensor. During a translation of the inner housing along the movement axis, the plurality of target members move with the inner housing from a first position to a second position indicative of the movement of the inner housing within the cavity.

In yet another embodiment, a pedal assembly is provided. The pedal assembly includes an outer housing, an inner housing, a pedal pad, and a sensor assembly. The outer housing has a cavity. The inner housing has a proximate end and an opposite distal end, an outer surface and an opposite an interior surface, a chamber extends between the proximate end and the distal end and is defined by the interior surface, and a continuous wall positioned within the chamber of the inner housing and spaced apart from the interior surface. The inner housing slidably received within the cavity of the outer housing. The pedal pad has an annular member extending from an inner surface of the pedal pad. The annular member is coupled to the inner housing. The pedal pad and the inner housing are configured to translate along a movement axis in response to a load applied to the pedal pad. The sensor assembly includes at least one target member coupled to the outer surface of the inner housing, and a sensor configured to sense a position of the at least one target member. During a translation of the inner housing along the movement axis, the at least one target member moves with the inner housing from a first position to a second position indicative of the movement of the inner housing within the cavity.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
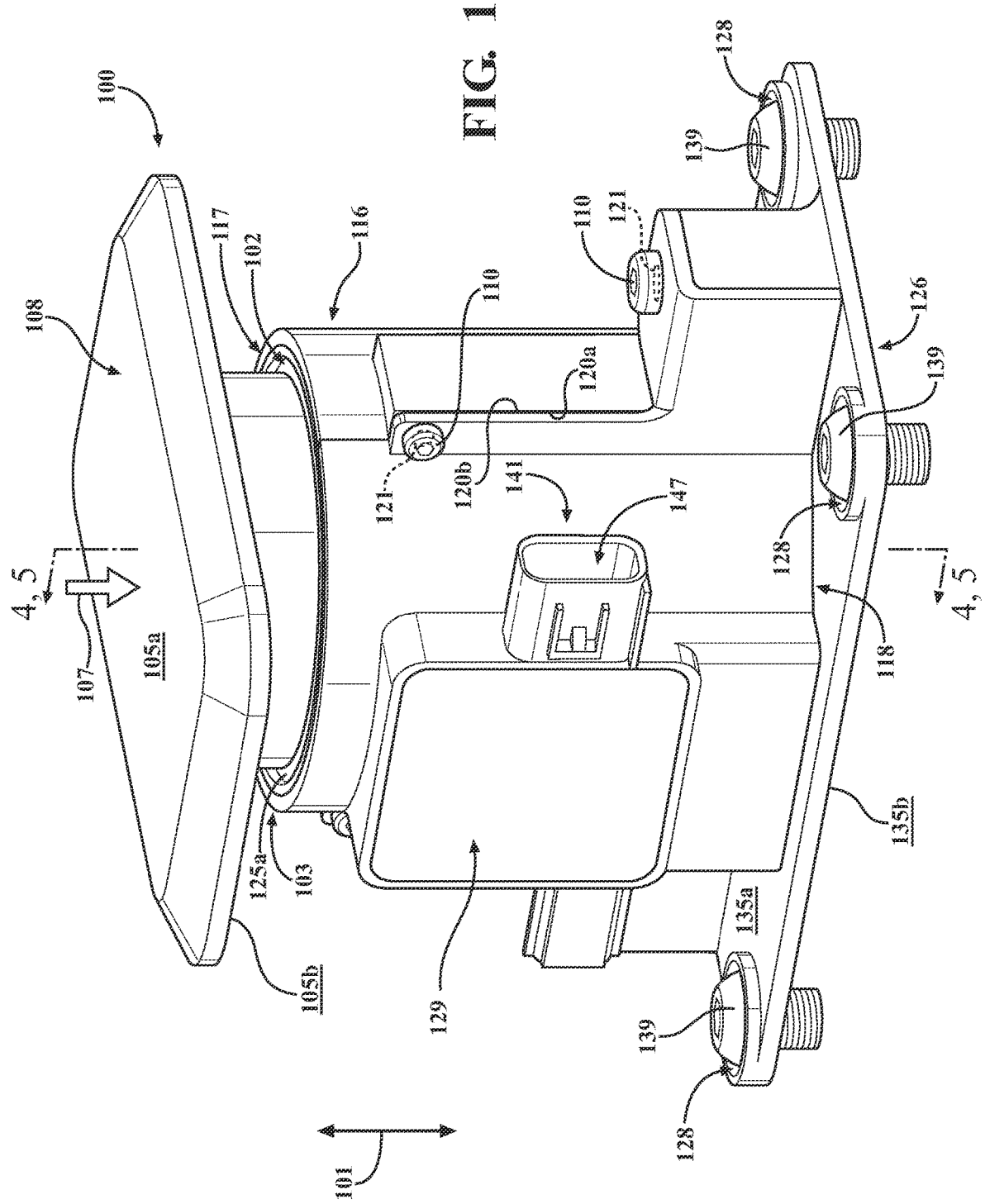
FIG. 1 schematically depicts a perspective view of an example pedal pad assembly according to one or more embodiments shown and described herein.

Novel pedal pad assemblies are provided. The pedal pad assemblies described herein provide for more accurate load balancing and sensing of redundant sensing technologies in minimum travel pedal assemblies.

Further, embodiments described herein include an inner housing positioned within a cavity of a bracket portion and a connector portion that together define or form an outer housing. A pedal pad extends from the inner housing and is configured to translate the housing along a movement axis in response to a load applied to the pedal pad. A pair of target members are coupled to the outer surface of the inner housing. A sensing assembly is provided within the connector portion. The sensing assembly may include an inductive sensor configured to sense movement of one of the pair of target members using inductive sensing techniques and a Hall Effect sensor configured to sense the other one of the pair of target members using Hall Effect techniques.

As such, during a translation of the inner housing along the movement axis, the pair of target members each move with the translation of the housing and are sensed using the respective technology. As such, a redundant sensing is performed using two different sensing technologies. Further, due to the placement, arrangement and redundant sensing, minimal travel movements in the translation of the inner housing along the movement axis are amplified such that the sensor assembly may easily sense the movement of the in the translation of the inner housing along the movement axis.

As used herein "minimal travel" or "reduced travel" or "limited travel" may be interchangeability used and refer to a pedal stroke of the pedal arm needed or required to detect the amount of load or force of the load applied to the pedal pad. In minimal travel pedal applications, the total travel of the pedal arm is 30 millimeters or less. As such, sensing the amount of travel of the pedal arm in these minimal travel applications for brake-by-wire applications must be precise due to the limited amount of pedal stroke. Load balancing of the pedal arm is desirable to detect a load applied to any portion of the pedal pad without the need for a direct center contact of the pedal pad. As such, the aspects of the pedal assemblies described herein are directed to minimal travel pedal assemblies with load balancing and strain gauge sensing that is more sensitive to the load applied to the pedal pad and is immune to load offset to sense any movement of the pedal arm regardless of where the load is applied to on the pedal pad.

As used herein, the term "communicatively coupled" means that coupled components are capable of exchanging data signals with one another such as, for example, electrical signals via conductive medium or a non-conductive medium, though networks such as via Wi-Fi, Bluetooth, and the like, electromagnetic signals via air, optical signals via optical waveguides, and the like.

As used herein, the term "proximal" or "first end" means closer to or in the direction of an origin of an element, such as a link member. The term "distal" or "second end" means further from the origin of the element. Put another way, the terms "distal" or "second end" mean opposite to the proximal end or first end of an element.

Figure 2:
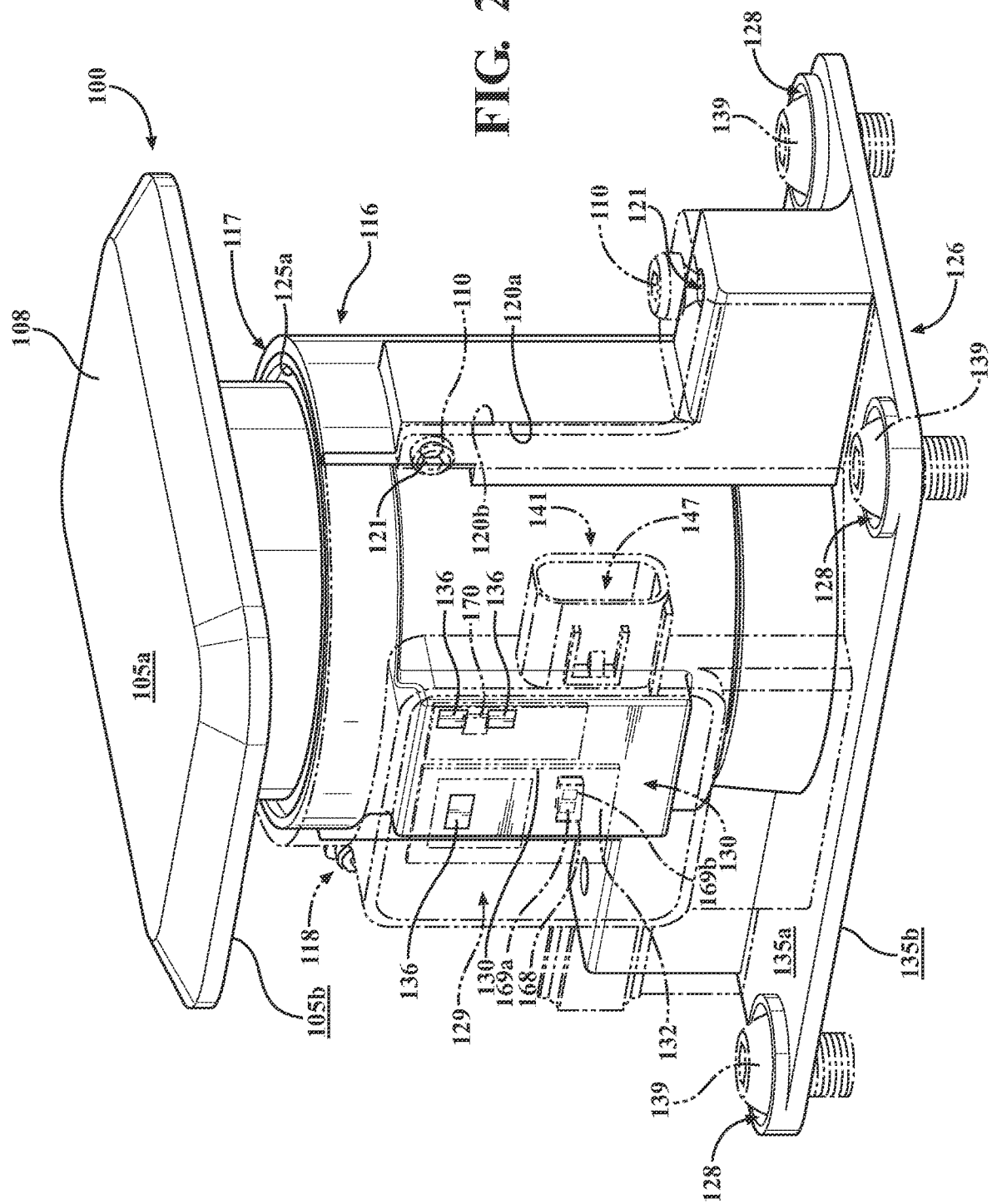
FIG. 2 schematically depicts a perspective view of the example pedal pad assembly of FIG. 1, with a connector portion illustrated in phantom, according to one or more embodiments shown and described herein.
Figure 3:
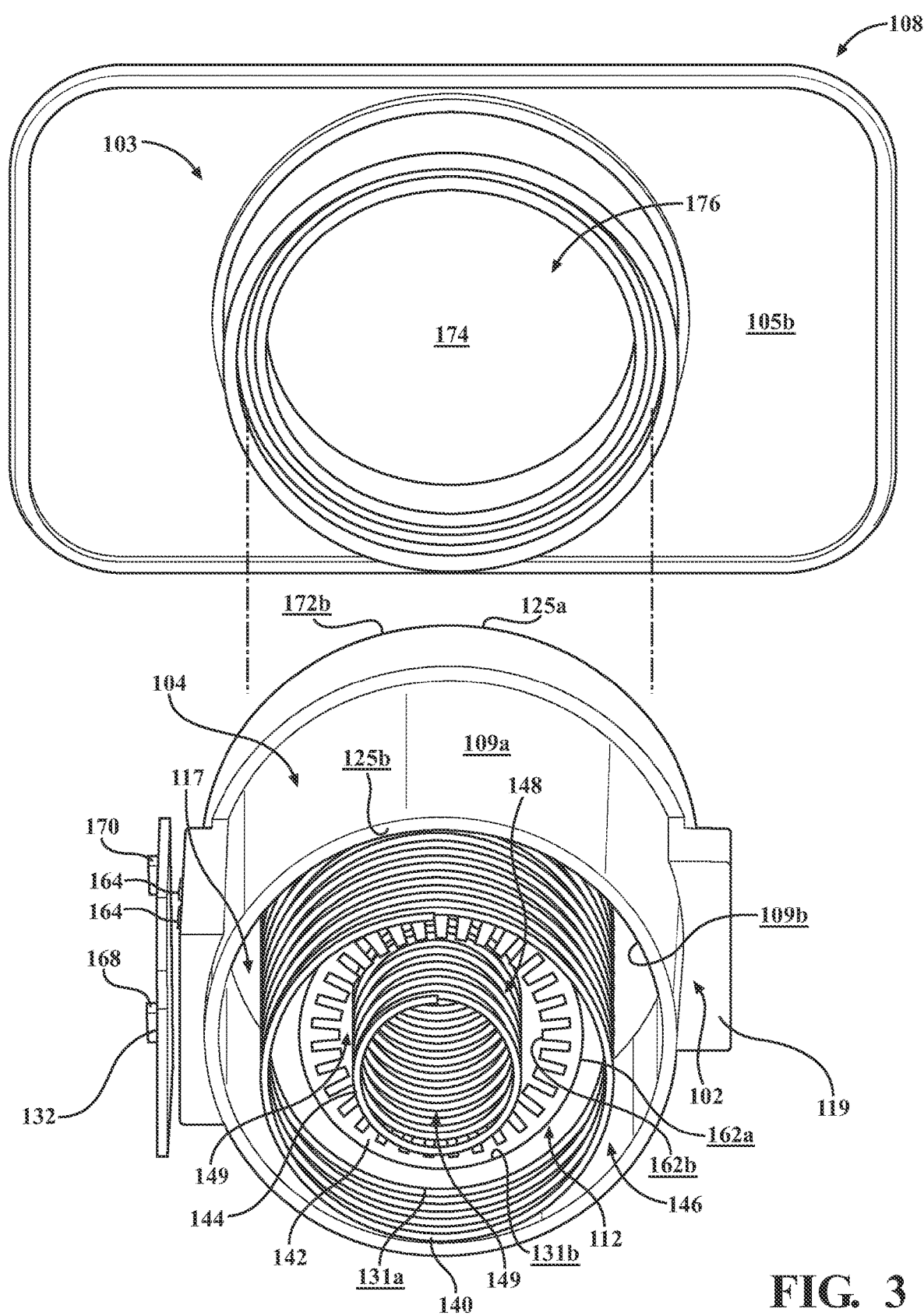
FIG. 3 schematically depicts a bottom view of an inner housing of the pedal assembly of FIG. 1, according to one or more embodiments shown and described herein.

Referring now to FIGS. 1-3, an example pedal pad assembly 100 may include an inner housing 102, a bracket portion 116, and a connector portion 118. The connector portion 118 and the bracket portion 116 are configured to each partially surround the inner housing 102 such that together the connector portion 118 and the bracket portion 116 form or define an outer housing with a cavity 117 formed therebetween that circumferentially surrounds the inner housing 102. That is, the connector portion 118 and the bracket portion 116 generally form half of the circumference of the cavity 117. As such, the connector portion 118 and the bracket portion 116 are configured to abut one another to define the cavity 117 that receives the inner housing 102.

The connector portion 118 and the bracket portion 116 each include complimentary flanges 120a, 120b, respectively, that abut one another with concentric bores 121 to couple the bracket portion 116 and connector portion 118 together using fasteners 110. Example fasteners 110 include, without limitation, rivets, screws, bolts and nuts, and the like. The bracket portion 116 may further include a base portion 126 that includes an exterior surface 135a and an opposite interior surface 135b. A plurality of bores 128 configured to receive to a plurality of fasteners 139 to couple the base portion 126 to a floor of a vehicle extend through the exterior surface 135a and the interior surface 135b. Example fasteners of the plurality of fasteners 139 include, without limitation, rivets, screws, bolts and nuts, and the like.

The example pedal pad assembly 100 described herein may be used for vehicles, such as but not limited to, electric vehicles or conventional gasoline vehicles. Further, the example pedal pad assembly 100 described herein may be used in conventional manual driving vehicles, autonomous vehicles, or hybrid vehicles. Other vehicles may also be used, such as off-road vehicles, water vehicles, and the like.

Portions of the exterior surface 135a may abut lower portions of the connector portion 118 such that portions of the connector portion 118 rest on or abut the exterior surface 135a of the base portion 126. As such, in some embodiments, the base portion 126 is formed integrally as part of the bracket portion 116 and as such may be a monolithic structure formed integrally as a single piece using injection molding, 3D printing techniques, and the like. In other embodiments, the base portion 126 may be coupled to the bracket portion 116 via fasteners such as rivets, screws, bolts and nuts, weld, epoxy, adhesive, and the like.

Figure 4:
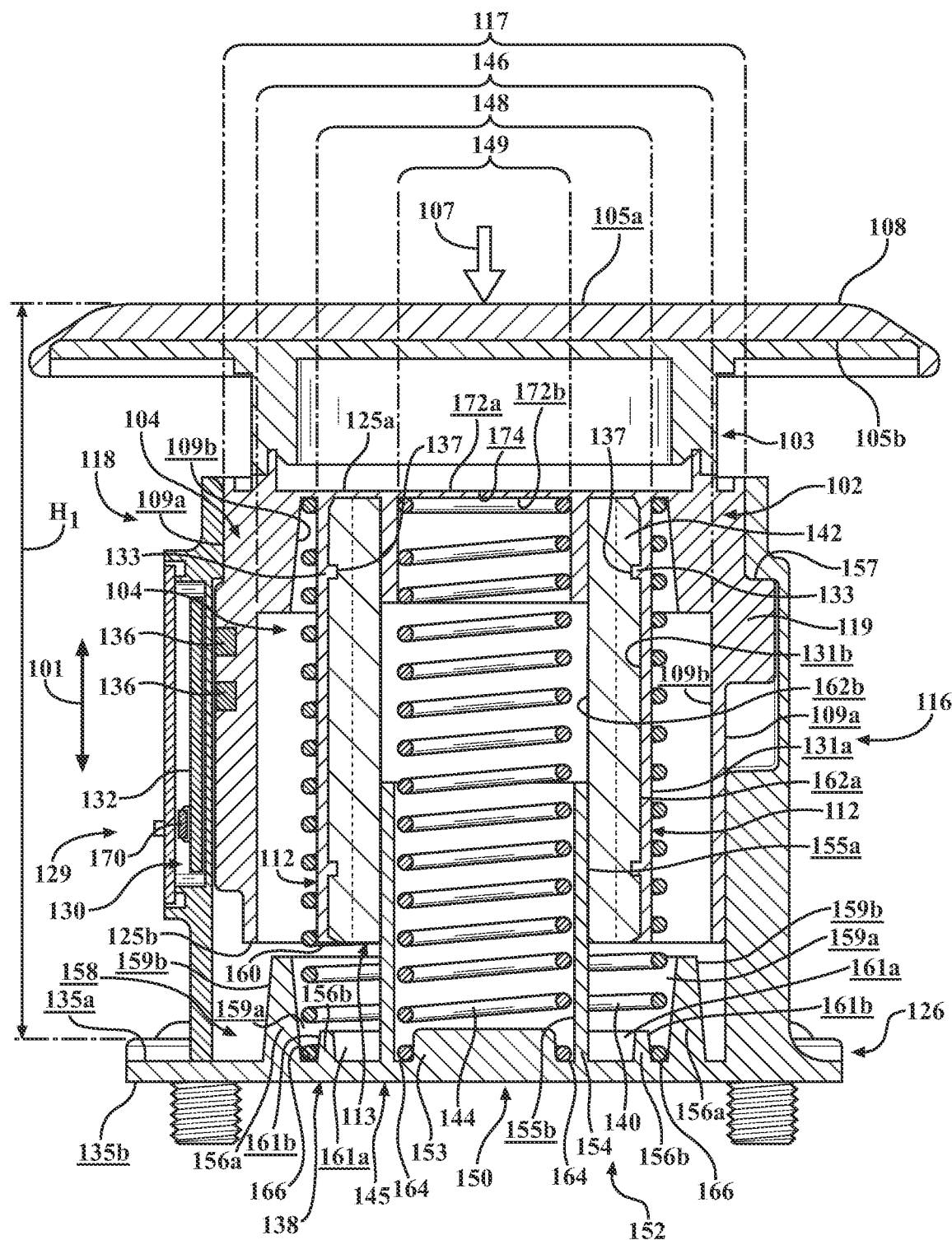
FIG. 4 schematically depicts a cross-sectional view of the pedal assembly of FIG. 1 taken from line 4-4 with a pedal pad in an undepressed state according to one or more embodiments shown and described herein.
Figure 5:
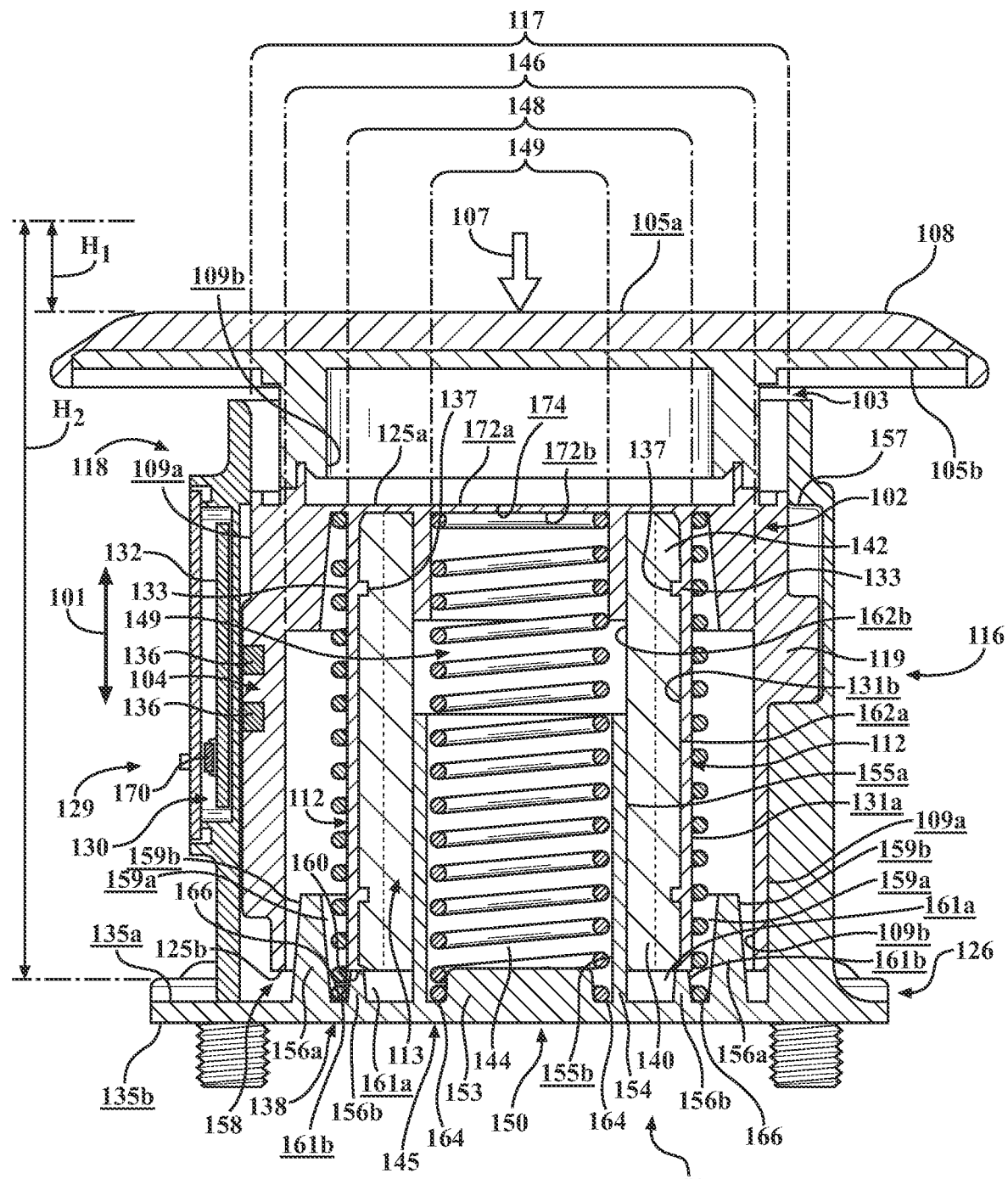
FIG. 5 schematically depicts a cross-sectional view of the pedal assembly of FIG. 2 taken from line 5-5 with the pedal pad in a depressed state according to one or more embodiments shown and described herein.

Referring now to FIGS. 4-5, the base portion 126 may further include a spring carrier portion 138 positioned within the cavity 117 and extending from the exterior surface 135a. The spring carrier portion 138 includes an inner spring retention portion 150 and an outer spring retention portion 152. The inner spring retention portion 150 has an inner protrusion portion 153 that may be annular or circular in shape and extending from the exterior surface 135a and a continuous wall portion 154 spaced apart from the inner protrusion portion 153 and extending from the exterior surface 135a of the base portion 126. The continuous wall portion 154 includes an exterior surface 155a and an opposite interior surface 155b. Further, a portion of the exterior surface 135a of the base portion 126 positioned between the inner protrusion portion 153 and the interior surface 155b and the continuous wall portion 154 forms a receiving portion 164 that may be annular to receive an end portion of a spring member, as described in greater detail herein.

The outer spring retention portion 152 includes a pair of spaced apart continuous protrusions 156a, 156b or walls and each may be annular shaped, cylindrical shaped, and/or the like, and extend from the exterior surface 135a of the base portion 126. As such, one of the pair of spaced apart protrusions is an outside continuous protrusion 156a that circumferentially surrounds the other one of the pair of spaced apart protrusions, referred to herein as an inner continuous protrusion 156b. The outside continuous protrusion 156a includes an inner surface 159a and an opposite outer surface 159b and the inner continuous protrusion 156b includes an inside surface 161a and an opposite outside surface 161b.

Each of the outside continuous protrusion 156a and the inner continuous protrusion 156b extend in a vertical direction from the exterior surface 135a of the base portion 126 in a direction away from the interior surface 135b. Further, the exterior surface 135a of the base portion 126 positioned between the pair of spaced apart continuous protrusions 156a, 156b forms a receiving portion 166 that may also be annular or cylindrical shaped and configured to receive an end portion of a pair of different spring members, as described in greater detail herein. That is, the receiving portion 166 may be formed by the exterior surface 135a between the outside surface 161b of the inner continuous protrusion 156b and the inner surface 159a of the outside continuous protrusion 156a.

Further, the outside continuous protrusion 156a may extend from the exterior surface 135a of the base portion 126 a greater height or distance from the exterior surface 135a in a vertical direction than the inner continuous protrusion 156b. Further, the inner continuous protrusion 156b is spaced apart from the exterior surface 155a of the continuous wall portion 154 of the inner spring retention portion 150. As such, the outside continuous protrusion 156a and the inner continuous protrusion 156b, and the receiving portion 166 formed therebetween may provide for the pair of different spring members to be separate and allow for the pair of different spring members to compresses into the base portion 126, as discussed in greater detail herein.

Referring back to FIGS. 1-2 and still referring to FIGS. 4-5, the connector portion 118 of the example pedal pad assembly 100 may further include a connector assembly 129 that includes a sensor assembly 130 and a connector 141. The sensor assembly 130 includes a circuit board 132 that may include a sensor 168 configured with transmitting coils 169a and receiving coils 169b adapted for and/or configured for inductive sensing and at least one Hall Effect sensing chip 170. Further, the sensor assembly 130 may include a plurality of target members 136. In some embodiments, at least one of the plurality of target members 136 is formed from a material that changes an electric field or changes eddy current in inductive sensing technologies. As such, in some embodiments, at least one of the plurality of target members 136 may be formed of a metallic material. Further, a different at least one of the plurality of target members 136 is formed from a material that changes a magnetic field in Hall Effect sensing technologies. As such, in some embodiments, the different at least one of the plurality of target members 136 may be formed of a magnetic material.

The plurality of target members 136 may be used in a redundant sensing using two different sensing techniques to determine the position of the inner housing 102 relative to the connector portion 118. In some embodiments, each of the plurality of target members 136 may be a generally rectangular shape. In other embodiments, each of the plurality of target members 136 may be any other shape, including triangular, circular, include lobes, pentagonal, irregular, and/or the like. Further, each of the plurality of target members 136 may be coupled to or embedded within the inner housing 102, as discussed in greater detail herein.

In operation, the sensor 168 configured with transmitting coils and receiving coils adapted for and/or configured for inductive sensing and the at least one Hall Effect sensing chip 170 may be configured to detect movement of the inner housing 102 by sensing a change in magnetic field caused from the at least one target member of the plurality of target members 136 embedded in or attached to the inner housing 102 and sensing a change in eddy currents and/or electric field caused from a different one of the at least one target member of the plurality of target members 136 embedded in or attached to the inner housing 102. As such, the sensor assembly 130 may be sensitive to a Hall Effect detection of magnetic field influence or change and inductive sensing changing of eddy currents and/or electric fields occurring as the inner housing 102 moves along the movement axis 101.

The connector 141 may include a receiving cavity 147 and that is communicatively coupled to a receiving member on a vehicle side where a signal may be sent from the sensor assembly 130 to the receiving member and then sent to other vehicle-side components such as an electronic control unit. The sensor assembly 130 may be configured to sense the position of the inner housing 102 along the movement axis 101, as discussed in greater detail herein.

Now referring to FIGS. 1-5, the inner housing 102 may include a proximate end 125a and an opposite distal end 125b. In some embodiments, a pedal pad 108 may include an annular member 103 that is coupled to extend from an inside surface 172a of the proximate end 125a of the inner housing 102. The pedal pad 108 includes an exterior surface 105a and an opposite interior surface 105b. In some embodiments, the annular member 103 may be integrally formed with the pedal pad 108 extending from the interior surface 105b as a monolithic single structure. In other embodiments, the annular member 103 may be coupled to the interior surface 105b via fasteners to extend from the interior surface 105b. Example fasteners include, without limitation, epoxy, adhesive, rivets, screws, bolt and nut, and the like.

In some embodiments, the annular member 103 may extend from the interior surface 105b of the pedal pad 108 to the proximate end 125a of the inner housing 102 and includes an annular member exterior surface 174 that abuts the outside surface 172b of the proximate end 125a of the inner housing 102. In some embodiments, the annular member 103 of the pedal pad 108 may include a receiving orifice 176 that receives at least a portion of the proximate end 125a of the inner housing 102. In some embodiments, the proximate end 125a of the inner housing 102 may be received by and coupled to the receiving orifice 176 of the annular member 103 via a snap fit configuration. In other embodiments, the annular member 103 of the pedal pad 108 may be coupled to the proximate end 125a via fasteners such as epoxy, adhesive, rivets, screws, bolt and nut, and the like. In other embodiments, the pedal pad 108 and the annular member 103 may be integrally formed with the inner housing 102 as a monolithic structure to extend from the proximate end 125a of the inner housing 102 as a single structure.

The pedal pad 108 may be configured to translate the inner housing 102 along a movement axis 101 in response to a load 107 applied to the pedal pad 108, (i.e., a depressive load 107 on the exterior surface 105a of the pedal pad 108).

Referring now to FIG. 3, the inner housing 102 may include a body 104 that has an outer surface 109a and an opposite inner surface 109b. In some embodiments, the body 104 may be cylindrical in shape to define a chamber 146 extending along and/or defined by the inner surface 109b between the proximate end 125a and the distal end 125b. The distal end 125b is open to the exterior surface 135a of the base portion 126 to receive the spring carrier portion 138 of the base portion 126 (e.g., the inner spring retention portion 150 and the outer spring retention portion 152). In other embodiments, the body 104 may be other shapes, such as square, rectangular, octagonal, hexagonal, and/or the like.

The body 104 may further include an inner continuous wall 112 extending from the inside surface 172a of the proximate end 125a towards the distal end 125b and includes an outer surface 131a and an opposite inner surface 131b. The inner continuous wall 112 is spaced apart from the inner surface 109b of the body 104. As such, the inner surface 109b of the body 104 circumferentially surrounds the outer surface 131a of the inner continuous wall 112. Further, in some embodiments, the inner continuous wall 112 defines an inner cavity 148. The inner cavity 148 may extend from an open end 113 of the inner continuous wall 112 and terminates at the inside surface 172a of the proximate end 125a.

The inner housing 102 is slidably movable within the cavity 117 defined by the bracket portion 116 and the connector portion 118. Further, in some embodiments, the inner housing 102 has a length equal to the amount of travel within the cavity 117 and, as discussed below, and is displaced by a spring tension, or bias, until a pressure that overcomes the spring tension, or bias, is applied to the pedal pad 108, as discussed in greater detail herein.

Further, in embodiments, the plurality of target members 136 may be located at any location or positioned along the outer surface 109a of the body 104 of the inner housing 102. In some embodiments, each of the plurality of target members 136 are coupled to the outer surface 109a of the body 104 by fasteners, such as epoxy, adhesive, rivets, screws, bolt and nut, and the like. In other embodiments, each of the plurality of target members 136 are embedded within or formed with the inner housing 102 such as during injection molding process, additive manufacturing techniques using 3D printing, and/or the like.

Now referring to back to FIGS. 3-5, depicted are cross sectional views of the example pedal pad assembly 100 of FIG. 1 depicted in FIG. 4 in an undepressed state, and the example pedal pad assembly 100 of FIG. 1 depicted in FIG. 4 in a depressed state. As such, in the depressed state, the load 107 is applied to the exterior surface 105a of the pedal pad 108. As shown in FIGS. 3-5, the example pedal pad assembly 100 may further include a first spring member 140 and a second spring member 144, together forming at least one spring element 145. The second spring member 144 may be coaxially aligned with the first spring member 140 to be at least partially nested within an inner circumference of the first spring member 140. Further, the inner continuous wall 112 may be at least partially nested within the inner circumference of the first spring member 140. In some embodiments, the first spring member 140 and/or the second spring member 144 may be coupled at one end to inside surface 172a of the proximate end 125a of the inner housing 102. In other embodiments, the first spring member 140 and/or the second spring member 144 may be coupled at one end to an annular member exterior surface 174 of the annular member 103. In other embodiments, the first spring member 140 and/or the second spring member 144 may be coupled at one end to the interior surface 105b of the pedal pad 108 opposite where the load 107 is applied to the exterior surface 105a by the user.

The first spring member 140 may be further positioned such that the other end of the first spring member 140 is received by and held in position by the receiving portion 166 positioned between the pair of spaced apart continuous protrusions 156a, 156b of the outer spring retention portion 152. As such, as the first spring member 140 is compressed, the other end of the first spring member 140 compresses against the exterior surface 135a of the base portion 126 in the receiving portion 166 positioned between the outside surface 161b of the inner continuous protrusion 156b and the inner surface 159a of the outside continuous protrusion 156a.

The second spring member 144 may be further positioned such that the other end of the second spring member 144 is received by and held in position by the receiving portion 164 and is positioned to receive a portion of the inner protrusion portion 153 extending from the exterior surface 135a and to be positioned within the interior surface 155b of the continuous wall portion 154.

The inner protrusion portion 153, the second spring member 144, the first spring member 140, the outside continuous protrusion 156a, and the inner continuous protrusion 156b may be concentrically aligned.

The first spring member 140 and/or the second spring member 144 may be configured to bias the pedal pad 108 to maintain the pedal pad 108 and the inner housing 102 in the undepressed position, or untranslated position, before the pedal pad assembly 100 experiences the load 107 (i.e. the depressive load) on the pedal pad 108, as best depicted in FIG. 4. That is, the first spring member 140 and/or the second spring member 144 may bias the pedal pad 108 is a direction of opposite movement of the pedal pad 108 when the load 107 is applied to the pedal pad 108. As such, an amount of magnitude of the load 107 applied to the pedal pad 108 needs to only be minimal to overcome the elastic potential energy of the first spring member 140 and/or the second spring member 144.

In some embodiments, the pedal pad assembly 100 may also include a bushing 142 positioned within the inner cavity 148 of the inner continuous wall 112. The bushing 142 includes an exterior surface 162a and an opposite inner surface 162b with an aperture 149 extending therethrough and defined by the interior surface 155b. In this embodiment, the inner spring retention portion 150 may be positioned within the aperture 149 of the bushing 142. The exterior surface 162a of the bushing 142 may also be in contact with the inner surface 131b of the inner continuous wall 112, the inner spring retention portion 150, or both. The bushing 142 may be free floating within the inner cavity 148 of the inner housing 102. Further, a portion of the exterior surface 162a of the bushing 142 may also be in contact with the interior surface 155b of the continuous wall portion 154.

As such, the second spring member 144 may be positioned within the aperture 149 of the bushing 142 and the bushing 142 may be positioned within the inner cavity 148 of the inner continuous wall 112 to abut the inner surface 131b of the inner continuous wall 112. Exterior to the outer surface 131a of the inner continuous wall 112 is the first spring member 140 within the chamber 146. Each of the second spring member 144, the bushing 142, the inner continuous wall 112, and the first spring member 140, are concentrically aligned. In some embodiments, the body 104 is also concentrically aligned with the second spring member 144, the bushing 142, the inner continuous wall 112, and the first spring member 140, Further, in some embodiments, each of the second spring member 144, the bushing 142, and the first spring member 140 may be free floating within the inner cavity 148 of the inner continuous wall 112. In other embodiments, the second spring member 144, the bushing 142, and the first spring member 140 may be coupled to the inside surface 172a of the proximate end 125a of the inner housing 102 at one end and to the exterior surface 135a of the base portion 126 at the other end. In other embodiments, the second spring member 144, the bushing 142, and the first spring member 140 may be coupled to the annular member exterior surface 174 of the annular member 103 at one end and to the exterior surface 135a of the base portion 126 at the other end. IT should be appreciated that the various arrangements of the second spring member 144, the bushing 142, the first spring member 140, and the inner housing provide a load balancing to the pedal pad 108 such that load 107 applied to anywhere on the pedal pad may cause a movement that is detected by the sensor assembly 130. As such, in minimal travel pedal assemblies, detecting and amplifying little movements are desirable.

In some embodiments, the bushing 142 may define one or more receiving features 137 on the exterior surface 155a of the bushing 142. Similarly, the inner continuous wall 112 may additionally define one or more coupling features 133 extending from the inner surface 131b and within the inner cavity 148 of the inner continuous wall 112. The one or more coupling features 133 may be shaped and sized to fit within the one or more receiving features 137, such that translation of the inner housing 102 along the movement axis 101 also translates the bushing 142.

The outer surface 109a of the body 104 may further include one more interference features 119 extending therefrom. The one or more interference features 119 may contact the bracket portion 116 and the connector portion 118, such as through an interior lip 157, thereby operating to keep the first spring member 140 and/or the second spring member 144 under a pre-specified or predetermined amount of compression, as well as preventing the inner housing 102 from completely exiting the cavity 117 defined by the bracket portion 116 and the connector portion 118.

Referring back to FIGS. 1-5, the example pedal pad assembly 100 may further define a clearance space 158, (i.e. 'travel path') formed between the distal end 125b of the inner housing 102 and the exterior surface 135a of the base portion 126. In operation, the inner housing 102 may translate through the clearance space 158 along the movement axis 101 to go from an untranslated position (i.e., undepressed) to a translated position (some load 107 applied to any portion of the exterior surface 105a of the pedal pad 108), depicted in FIG. 4 before the load 107 and in FIG. 5 after experiencing the load 107. In embodiments, although not shown, the lower surface 160 of the base portion 126 may further include a cushioning element disposed on the exterior surface 135a of the base portion 126, operable to prevent a jarring impact to the inner housing 102 when the example pedal pad assembly 100 experiences the load 107. Example cushioning elements may include rubber, silicone, foam, elastic, plastic, nylon, and the like.

Figure 6:
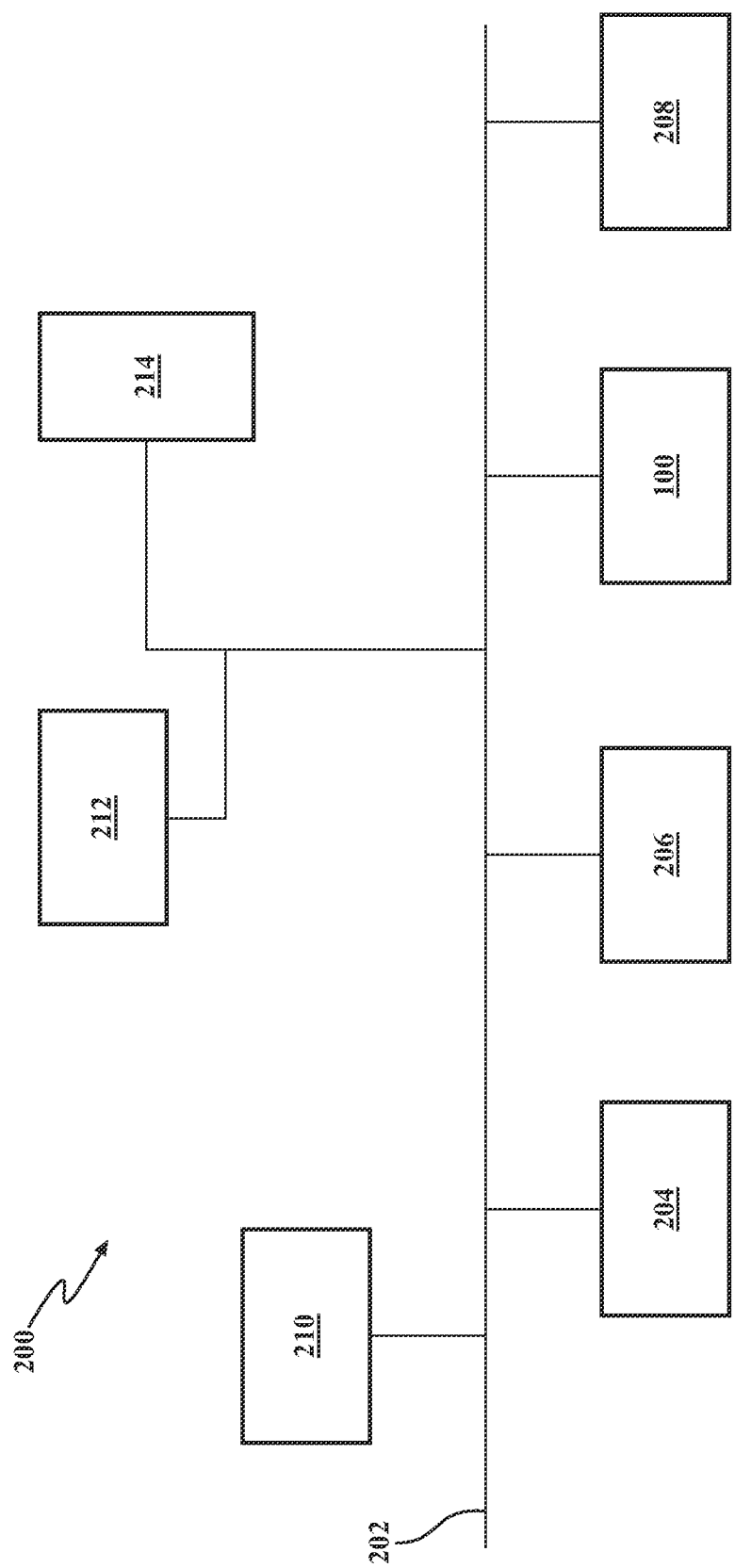
FIG. 6 schematically illustrates a system for utilizing the pedal assemblies of FIGS. 1-5, according to one or more embodiments shown and described herein.

Now referring to FIG. 6, a system 200 for utilizing the pedal pad assembly 100 is illustrated. The system 200 may include one or more processors 204. The system 200 may further include a communication pathway 202, whereby the one or more processors 204, a non-transitory computer storage medium 206, a database 208, a vehicle side system 210 (e.g., an electronic control unit configured to provide braking and/or acceleration controls to the vehicle), a server 212, a computing device 214, and the pedal pad assembly 100 itself may be communicatively coupled through the communication pathway 202 to each other. The one or more processors 204 may be communicatively coupled to the example pedal pad assembly 100 and the non-transitory computer storage medium 206, wherein the non-transitory computer storage medium 206 may store machine-readable instructions. The machine-readable instructions, when executed by the one or more processors 204 (such as through the communication pathway 202), may cause the one or more processors 204 to convert a displacement measurement of each of the plurality of target members 136 (FIG. 4) to an electronic or electromagnetic signal, such as a digital or analogue value. In other words, the machine-readable instructions may cause the one or more processors 204 to translate a distance between an untranslated position of the inner housing 102 and a translated position of the inner housing 102 along the movement axis 101 into an output signal comprising a digital or analogue value, and convert the output signal into an expected brake load or an expected acceleration load for the vehicle.

Now referring to FIGS. 1-6, in operation, the configurations of the inner housing 102 and the sensor assembly 130 may allow a relative transformation and amplification of the positions of the components in response to the load 107 applied to the pedal pad 108. For example, during translation of the inner housing 102 along the movement axis 101, the plurality of target members 136 may move, rotate or pivot while coupled to the outer surface 109a of the inner housing 102 indicative of a movement of the inner housing 102 caused by the load 107 applied to the pedal pad 108. This movement from a first position, depicted by arrow H1 in FIG. 4, to a second positon, depicted by arrow H2 in FIG. 5, is detected by the sensor assembly 130. In other words, the inner housing 102 may move or slide in a direction opposite of the bias form the spring members and in the direction of the load 107 applied to any portion of the pedal pad 108, which then moves the plurality of target members 136, which are sensed using different, redundant sensing techniques, as discussed in greater detail herein.

That is, due to the arrangement of the components of the example pedal pad assembly 100, a load balancing is possible so that any load 107 applied to anywhere on the exterior surface 105a of the pedal pad 108 may be amplified such that minimal travel may be sensed by the sensor assembly 130.

In embodiments, the example pedal pad assembly 100 may further include a load sensor coupled at one end to the at least one spring element and at the other end to the base portion 126. Without being limited by theory, the load sensor may find applicability in electric vehicles, wherein a primary brake system may be used to control the traditional braking system and a secondary brake system may be used to control a regenerative braking mechanism. For example, and in embodiments, the primary brake system may include the at least one spring element and the load sensor, and the secondary brake system may include the at least one sensor described previously.

Without being limited by theory, the elements of the example pedal pad assembly 100 previously discussed may be formed by any one of a number of methods. Particularly, forming methods may include, but may not be limited to injection molding or 3D printing of the individual components, or of the pedal pad assembly 100 as a whole, as would be understood in the art.

The components of the example pedal pad assembly 100, such as the inner housing 102, the pedal pad 108, the connector portion 118, and bracket portion 116, for instance, may be formed from a plastic material. For example, the example pedal pad assembly 100 may be formed with various materials such as acrylonitrile butadiene styrene (ABS), polyethylene (PE), polypropylene (PP), polycarbonate (PC), nylon, polycarbonate/acrylonitrile butadiene styrene, polyurethane, polymethyl methacrylate, high density polyethylene, low density polyethylene, polystyrene, PEEK, POM (Acetal/Delrin), polyethylene terephthalate, thermoplastic elastomer, polyetherimide, theremoplastic vulcanizate, polysulfone, combinations thereof, and/or the like. Additionally, additives may be added such as UV absorbers, flame-retardants, colorants, glass fibers, plasticizers and/or the like.

Further, the first spring member 140 and/or the second spring member 144 may be formed with hardened steel, music wire, stainless steel, bronze, brass, oil tempered wire, phosphor, and the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A pedal pad assembly comprising:
    an outer housing having a cavity;
    an inner housing having an outer surface and slidably received within the cavity of the outer housing;
    a pedal pad coupled to the inner housing and configured to translate the inner housing along a movement axis in response to a load applied to the pedal pad; and
    a sensor assembly having:
        a plurality of target members coupled to the outer surface of the inner housing, and
        a first sensor configured to sense a position of the at least one target member of the plurality of target members, the first sensor is an inductive sensing sensor having a transmitting coil and at least one receiving coil, and
        a second sensor, wherein the second sensor is a Hall Effect sensor,
    wherein, during a translation of the inner housing along the movement axis, the at least one target member of the plurality of target members moves with the inner housing from a first position to a second position indicative of the movement of the inner housing within the cavity.

2. The pedal pad assembly of claim 1, wherein the outer housing is formed from a bracket portion and a connector portion circumferentially surrounding the inner housing.

3. The pedal pad assembly of claim 1, wherein at least one of the plurality of target members is configured to influence an eddy current or an electric field of the inductive sensing sensor.

4. The pedal pad assembly of claim 3, wherein at least one of the plurality of target members is configured to influence a magnetic field sensed by the Hall Effect sensor.

5. The pedal pad assembly of claim 1, wherein the inner housing further includes a proximal end, an opposite distal end, and an interior surface, a chamber extends between the proximate end and the distal end and is defined by the interior surface.

6. The pedal pad assembly of claim 5, wherein the inner housing further includes a continuous wall positioned within the chamber of the inner housing and spaced apart from the interior surface, the continuous wall defines a second cavity.

7. The pedal pad assembly of claim 6, wherein the pedal pad further comprises:
    an annular member extending from an inner surface of the pedal pad.

8. The pedal pad assembly of claim 7, further comprising:
    at least one spring member positioned within the cavity of the inner housing, the at least one spring member coupled to the annular member of the pedal pad and configured to bias the pedal pad in a direction of opposite movement when the load is applied.

9. The pedal pad assembly of claim 8, wherein:
    the at least one spring member comprises a first spring member and a second spring member concentrically aligned, the first spring member configured to circumferentially surround the continuous wall and the second spring member is received within the second cavity.

10. The pedal pad assembly of claim 9, further comprising:
    a bushing having an aperture is positioned within the second cavity of the inner housing, the second spring member is received within the aperture of the bushing.

11. The pedal pad assembly of claim 1, wherein at least one of the plurality of targets is formed from a non-magnetic metallic material and at least a different one of the plurality of targets is formed from a magnetic material.

12. A pedal assembly comprising:
    an outer housing having a cavity;
    an inner housing having a proximate end, an opposite distal end, and an outer surface, the inner housing slidably received within the cavity of the outer housing;
    a pedal pad having an annular member extending from an inner surface of the pedal pad, the annular member coupled to the inner housing, the pedal pad and the inner housing configured to translate along a movement axis in response to a load applied to the pedal pad; and
    a sensor assembly having:
        a plurality of target members coupled to the outer surface of the inner housing,
        a first sensor is an inductive sensing sensor having a transmitting coil and at least one receiving coil and is configured to sense a position of at least one of the plurality of target members, the least one of the plurality of target members is configured to influence an eddy current or an electric field of the first sensor, and
        a second sensor is a Hall Effect sensor and is configured to sense a position of a second target member of the at least one of the plurality of target members, the second target member of the at least one of the plurality of target members is configured to influence a magnetic field sensed by the Hall Effect sensor,
    wherein, during a translation of the inner housing along the movement axis, the plurality of target members move with the inner housing from a first position to a second position indicative of the movement of the inner housing within the cavity.

13. The pedal assembly of claim 12, wherein the inner housing further includes a chamber extending between the proximate end and the distal end and is defined by the interior surface.

14. The pedal assembly of claim 13, wherein the inner housing further includes a continuous wall positioned within the chamber of the inner housing and spaced apart from the interior surface.

15. The pedal assembly of claim 14, wherein the continuous wall defines a second cavity.

16. The pedal assembly of claim 15, further comprising:
at least one spring member positioned within the cavity of the inner housing, the at least one spring member coupled to the annular member of the pedal pad and configured to bias the pedal pad in a direction of opposite movement when the load is applied.

17. The pedal assembly of claim 16, wherein:
the at least one spring member comprises a first spring member and a second spring member concentrically aligned, the first spring member configured to circumferentially surround the continuous wall and the second spring member is received within the second cavity.

18. The pedal assembly of claim 17, further comprising:
a bushing having a bushing cavity is positioned within the second cavity of the inner housing, the second spring member is received within the bushing cavity of the bushing.

19. A pedal assembly comprising:
an outer housing having a cavity;
an inner housing having:
  a proximate end and an opposite distal end,
  an outer surface and an opposite interior surface,
  a chamber extends between the proximate end and the distal end and is defined by the interior surface, and
  a continuous wall positioned within the chamber of the inner housing and spaced apart from the interior surface,
  wherein the inner housing slidably received within the cavity of the outer housing;
a pedal pad having an annular member extending from an inner surface of the pedal pad, the annular member coupled to the inner housing, the pedal pad and the inner housing configured to translate along a movement axis in response to a load applied to the pedal pad; and
a sensor assembly having:
  at least one target member coupled to the outer surface of the inner housing, and
  a first sensor configured to sense a position of the at least one target member, the first sensor is an inductive sensing sensor having a transmitting coil and at least one receiving coil, and
  a second sensor, wherein the second sensor is a Hall Effect sensor,
wherein, during a translation of the inner housing along the movement axis, the at least one target member moves with the inner housing from a first position to a second position indicative of the movement of the inner housing within the cavity.

20. The pedal assembly of claim 19, further comprising:
a first spring member and a second spring member positioned within the cavity of the inner housing, the first spring member and the second spring member configured to bias the pedal pad in a direction of opposite movement when the load is applied, the first spring member configured to circumferentially surround the continuous wall, the continuous wall defines a second cavity; and
a bushing having a bushing cavity is positioned within the second cavity of the inner housing, the second spring member is received within the bushing cavity of the bushing.

* * * * *